United States Patent [19]
Lemelson et al.

[11] Patent Number: 6,083,570
[45] Date of Patent: Jul. 4, 2000

[54] SYNTHETIC DIAMOND COATINGS WITH INTERMEDIATE AMORPHOUS METAL BONDING LAYERS AND METHODS OF APPLYING SUCH COATINGS

[76] Inventors: Jerome H. Lemelson, 868 Tyler Way, Incline Village, Nev. 89540; James G. Conley, 443 Jefferson Ave., Glencoe, Ill. 60022

[21] Appl. No.: 08/835,808

[22] Filed: Apr. 16, 1997

Related U.S. Application Data

[63] Continuation of application No. 08/689,771, Aug. 12, 1996, abandoned, which is a continuation of application No. 08/482,086, Jun. 7, 1995, abandoned, which is a continuation-in-part of application No. 07/487,940, Mar. 5, 1990, abandoned, which is a continuation-in-part of application No. 07/032,352, Mar. 31, 1987, Pat. No. 4,960,643.

[51] Int. Cl.$^7$ ................................................ C23C 16/27
[52] U.S. Cl. .......................... 427/554; 427/577; 427/596; 427/249.8; 427/249.14; 427/314; 427/318
[58] Field of Search ........................................ 427/554, 577, 427/596, 597, 249, 314, 318, 249.8, 249.14

[56] References Cited

U.S. PATENT DOCUMENTS

| | | | |
|---|---|---|---|
| 2,411,867 | 12/1946 | Brenner | 51/309 |
| 2,793,282 | 5/1957 | Steigerwald | 219/69 |
| 2,861,166 | 11/1958 | Cargill, Jr. | 219/34 |
| 2,947,610 | 8/1960 | Hall | 23/209.1 |
| 2,968,723 | 1/1961 | Steigerwald | 250/49.5 |
| 3,141,746 | 7/1964 | De Lai | 51/307 |
| 3,207,582 | 9/1965 | Inoue | 23/209.1 |
| 3,346,458 | 10/1967 | Schmidt | 176/1 |
| 3,702,573 | 11/1972 | Nemeth | 76/101 A |
| 3,714,332 | 1/1973 | Rasquin et al. | 423/446 |
| 3,769,084 | 10/1973 | Saito et al. | 428/634 |
| 3,913,280 | 10/1975 | Hall | 51/307 |
| 3,916,506 | 11/1975 | Wolf | 428/457 |
| 3,929,432 | 12/1975 | Caveney | 51/295 |
| 3,959,557 | 5/1976 | Berry | 428/368 |
| 4,054,426 | 10/1977 | White | 51/309 R |
| 4,084,942 | 4/1978 | Villalobos | 51/307 |
| 4,385,880 | 5/1983 | Lemelson | 425/77 |
| 4,434,188 | 2/1984 | Kamo et al. | 427/39 |
| 4,490,229 | 12/1984 | Mirtich et al. | 204/192 C |
| 4,504,519 | 3/1985 | Zelez | 427/39 |
| 4,554,208 | 11/1985 | MacIver et al. | 428/332 |
| 4,594,294 | 6/1986 | Eichen et al. | 428/552 |
| 4,621,031 | 11/1986 | Scruggs | 428/627 |
| 4,663,183 | 5/1987 | Ovshinsky et al. | 427/39 |
| 4,707,384 | 11/1987 | Schachner et al. | 427/249 |
| 4,725,345 | 2/1988 | Sakamoto et al. | 204/192.31 |
| 4,734,339 | 3/1988 | Schachner et al. | 428/701 |
| 4,755,237 | 7/1988 | Lemelson | 148/152 |
| 4,764,434 | 8/1988 | Aronsson et al. | 428/565 |
| 4,776,862 | 10/1988 | Wiand | 51/293 |
| 4,783,368 | 11/1988 | Yamamoto et al. | 428/446 |
| 4,816,286 | 3/1989 | Hirose | 427/39 |
| 4,834,806 | 5/1989 | Hashimoto et al. | 148/512 |
| 4,837,089 | 6/1989 | Araki et al. | 428/552 |
| 4,849,199 | 7/1989 | Pinneo | 423/446 |
| 4,859,493 | 8/1989 | Lemelson | 427/45.1 |
| 4,874,596 | 10/1989 | Lemelson | 423/446 |
| 4,882,138 | 11/1989 | Pinneo | 423/446 |
| 4,904,542 | 2/1990 | Mroczkowski | 428/610 |
| 4,960,643 | 10/1990 | Lemelson | 428/408 |
| 4,968,326 | 11/1990 | Wiand | 51/293 |
| 4,974,498 | 12/1990 | Lemelson | 92/223 |
| 5,009,966 | 4/1991 | Garg et al. | 428/634 |
| 5,021,628 | 6/1991 | Lemelson | 219/121.6 |
| 5,040,501 | 8/1991 | Lemelson | 123/188 AA |
| 5,067,826 | 11/1991 | Lemelson | 384/492 |
| 5,096,352 | 3/1992 | Lemelson | 411/424 |
| 5,124,179 | 6/1992 | Garg et al. | 427/249 |
| 5,131,941 | 7/1992 | Lemelson | 75/10.19 |
| 5,132,587 | 7/1992 | Lemelson | 313/141 |
| 5,137,398 | 8/1992 | Omori et al. | 408/145 |
| 5,161,728 | 11/1992 | Li | 228/12 V |
| 5,190,823 | 3/1993 | Anthony et al. | 428/408 |
| 5,224,969 | 7/1993 | Chen et al. | 51/295 |
| 5,239,746 | 8/1993 | Goldman | 29/840 |
| 5,284,394 | 2/1994 | Lemelson | 384/463 |
| 5,366,556 | 11/1994 | Prince et al. | 118/722 |
| 5,370,195 | 12/1994 | Keshavan et al. | 175/420.2 |
| 5,382,293 | 1/1995 | Kawarada et al. | 118/723 DC |
| 5,391,407 | 2/1995 | Dearnaley | 427/527 |
| 5,391,409 | 2/1995 | Shibata et al. | 427/577 |
| 5,392,982 | 2/1995 | Li | 228/124.5 |
| 5,401,543 | 3/1995 | O'Neill et al. | 427/580 |
| 5,403,399 | 4/1995 | Kurihara et al. | 118/723 DC |
| 5,456,406 | 10/1995 | Lemelson | 148/525 |

FOREIGN PATENT DOCUMENTS

| | | |
|---|---|---|
| 57-106513 | 7/1982 | Japan . |
| 60-195094 | 10/1985 | Japan . |
| 61-106494 | 5/1986 | Japan . |
| 61-124573 | 6/1986 | Japan . |
| 62-72921 | 4/1987 | Japan . |
| 62-196371 | 8/1987 | Japan . |

OTHER PUBLICATIONS

Narayan et al., J. App. Phys., vol. 71, No. 2, pp. 966–971, Jan. 1992.
Article: "Laser Method for Synthesis and Processing of Continuous Diamond Films on Nondiamond Substrates," Narayan et al., Apr. 19, 1991 (*Science*, vol. 252.
Article: "Growth mechanisms of diamond–Like films formed by laser ablation of graphite," Bourdon et al., Aug. 20, 1990(Publication) (*Applied Surface Science*).
Article: "The bonding of protective films of amorphic diamond to titanium," Collins et al., Dec. 16, 1991 (Publication),(*Journal of Applied Physics*, vol. 71, No. 7).
Article: "Low–Pressure, Metastable Growth of Diamond and 'Diamond–like' Phases," John C. Angus & Cliff C. Hayman, Aug. 19, 1988, *Science*, p. 913.
Article: "New Glasses Arise from Liquid's Slow Flow," R. Lipkin, Apr. 1, 1995, *Science*, p. 199.

*Primary Examiner*—Timothy Meeks
*Attorney, Agent, or Firm*—Niro, Scavone, Haller & Niro

[57] ABSTRACT

This invention relates to methods of making new and improved diamond, "diamond-like carbon" (a-C) and "diamond-like hydrocarbon" (a-C:H) coatings bonded to substrates by using intermediate bonding layers comprising amorphous "glassy" metals, engineered to reduce the residual stress in the diamond coatings, and to articles of manufacture made using such methods.

4 Claims, No Drawings

SYNTHETIC DIAMOND COATINGS WITH INTERMEDIATE AMORPHOUS METAL BONDING LAYERS AND METHODS OF APPLYING SUCH COATINGS

CROSS-REFERENCE TO RELATED APPLICATION

This application is a continuation of application Ser. No. 08/689,771 filed on Aug. 12, 1996, now abandoned, which is a continuation of Ser. No. 08/482,086 filed on Jun. 7, 1995, now abandoned, which is a continuation-in-part of Ser. No. 07/487,940 filed on Mar. 5, 1990, now abandoned, which is a continuation-in-part of Ser. No. 07/032,352, filed Mar. 31, 1987, now U.S. Pat. No. 4,960,643. The disclosures of the foregoing applications are incorporated by reference herein.

BACKGROUND OF THE INVENTION

1. Field of the Invention

This invention relates to methods of making new and improved diamond, "diamond-like carbon" (a-C) and "diamond-like hydrocarbon" (a-C:H) coatings bonded to substrates by using intermediate bonding layers comprising amorphous "glassy" metals, engineered to reduce the residual stress in the diamond coatings, and to articles of manufacture made using such methods.

2. Background of the Invention

Diamond, diamond-like carbon and diamond-like hydrocarbon coatings have been employed both to provide hard faces on engineered materials and as abrasive coatings on articles made from such materials. Typically such diamond films and/or particles are applied using some form of chemical vapor deposition (CVD) process. Such processes generally use thermal decomposition of a mixture of hydrogen and carbon compounds, preferably hydrocarbons, into diamond generating carbon atoms preferentially from the gas phase activated in such a way as to avoid substantially the deposition of graphitic carbon. The specific types of carbon compounds useful for CVD include C1–C4 saturated hydrocarbons such as methane, ethane, propane and butane; C1–C4 unsaturated hydrocarbons such as acetylene, ethylene, propylene and butylene; gases containing C and O such as carbon monoxide and carbon dioxide; aromatic compounds such as benzene, toluene, xylene, and the like; and organic compounds containing C, H. and at least one of oxygen and/or nitrogen such as methanol, ethanol, propanol, dimethyl ether, diethyl ether, methylamine, ethylamine, acetone, and similar materials (see U.S. Pat. No. 4,816,286). The concentration of carbon compounds in the hydrogen gas can vary from about 0.1% to about 5%, preferably from about 0.2% to 3%, and more preferably from about 0.5% to 2%. The resulting diamond film in such a deposition method is in the form of adherent individual crystallites or a layer-like agglomerates of crystallites substantially free from intercrystalline adhesion binder.

Such CVD processes are known to those skilled in the art, and ordinarily use some form of energy (for example, microwave radiation, as in U.S. Pat. No. 4,859,493 and in U.S. Pat. No. 4,434,188) to pyrolyze hydrocarbon gases such as methane at concentrations of about 1% to 2% in a low pressure (about 10 torr) hydrogen atmosphere, causing deposition of diamond or "diamond-like carbon" (a-C) or "diamond-like hydrocarbon" (a-C:H) particles or film on a nearby substrate. (Diamond and "diamond-like carbon" (a-C) coatings have an atomic hydrogen fraction of zero; for "diamond-like hydrocarbon" (a-C:H) coatings that fraction ranges from about 0.15 to about 0.6. Diamond coatings have atom number densities around 0.29 gram-atoms per cubic centimeter; "diamond-like carbon" (a-C) and "diamond-like hydrocarbon" (a-C:H) materials are characterized by atom number densities above 0.19 gram-atoms per cc.) It is also known to assist the CVD process using a variety of techniques including (1) pyrolysis by a hot tungsten filament intended to generate atomic hydrogen near the substrate (HFCVD); (2) supplying electrons by negatively biasing the filament as in electron-assisted chemical vapor deposition (EACVD); (3) creating a plasma using microwave energy or RF energy (PACVD; see U.S. Pat. Nos. 4,504,519 and 5,382,293); (4) using an argon ion beam to decompose the hydrocarbon feedstock, as in U.S. Pat. No. 4,490,229 and (5) using direct-current electrical discharge methods. See, generally, John C. Angus and Cliff C. Hayman, "Low-Pressure, Metastable Growth of Diamond and 'Diamond-like' Phases," Science, Aug. 19, 1988, at p. 913. The disclosures of the U.S. patent references cited above are incorporated by reference herein.

The ion beam deposition method typically involves producing carbon ions by heating a filament and accelerating carbon ions to selected energies for deposit on a substrate in a high vacuum environment. Ion beam systems use differential pumping and mass separation techniques to reduce the level of impurities in the carbon ion flow to the growing film.

The chemical vapor deposition and plasma enhanced chemical vapor deposition methods are similar in operation. Both methods use the dissociation of organic vapors (such as $CH_3OH$, $C_2H_2$, and $CH_3OHCH_3$) to produce both carbon ions and neutral atoms of carbon for deposit on a substrate. Plasma enhanced methods are described in U.S. Pat. No. 5,382,293 and U.S. No. 5,403,399.

Non-hydrogenated diamond-like carbon (a-C) films can be applied using a variety of techniques, which include magnetron sputtering, electron beam physical vapor deposition (EBPVD), laser photo-ablation, mass-filtered carbon ion beam deposition and cathodic arc plasma deposition, as described in U.S. Pat. No. 5,401,543 (incorporated by reference herein).

Sputtering deposition usually includes two ion sources, one for sputtering carbon from a graphite source onto a substrate, and another ion source for breaking the unwanted graphite bonds in the growing film. In the typical sputtering method, an argon ion sputtering gun sputters pure carbon atoms off of a graphite target within a vacuum chamber, and the carbon atoms are condensed onto a substrate. Simultaneously, another argon ion source bombards the substrate to enhance the breakdown of the graphite bonding in favor of a diamond-like $sp^3$ tetrahedral bond in the growing carbon film.

It is also known to apply polycrystalline diamond layers using sintering at simultaneous high pressures (50 kbar) and temperatures (1300° C.) to create conditions under which the diamond phase is thermodynamically stable, as in U.S. Pat. No. 5,370,195. And liquid-phase diffusion metallizing techniques also have been suggested for bonding diamond to certain types of substrates, as in U.S. Pat. No. 5,392,982.

Synthetic diamond-coated articles have found a wide variety of uses. U.S. Pat. No. 4,960,643, for example, discloses articles coated with synthetic diamond particles of controlled size, to which an overlying film, for example of chromium, has been applied to help the diamond layer resist scratching and wear. Other patents disclose various diamond-coated articles of manufacture, including bearings (U.S. Pat. No. 5,284,394); fasteners (U.S. Pat. No. 5,096,352); engine parts (U.S. Pat. Nos. 5,132,587 and 4,974,498) and the like.

The usefulness of diamond-coated engineered materials, and especially those made by CVD techniques, has been limited, however, by the large residual stress which remains in the finished composite products after coating is complete and the coated article has cooled. The stress arises from the very large differences in coefficients of thermal expansion (CTE) between the diamond coating (which have very low CTE's) and the substrates to which it is desired to bond it (often a metal having a much higher CTE). The substrate contracts during cooling more than the diamond film, leaving the diamond film in a permanent state of compressive stress which promotes spalling and cracking. The effect is aggravated by the high elastic modulus (low compressibility) of diamond compared to that of the substrate.

Prior attempts to address the problem of fragility and crack propagation caused by residual stress have included providing soft, metallic braze layers, as in U.S. Pat. No. 4,968,326, sometimes molybdenum-based or carbide-based, as in U.S. Pat. No. 4,776,862. It has also been suggested to supply an intermediate braze layer in the form of multiple elements such as discs with dissimilar centers and edges between the metal and the diamond being bonded together. See U.S. Pat. No. 5,392,982. Such complex, multi-part intermediate layers are unsuited to situations in which uniform properties over a comparatively large coating area are desired and would also be difficult to adapt to CVD diamond film application techniques. Similarly, techniques that require drilling holes through the diamond layer to mechanically assist in bonding, as in U.S. Pat. No. 5,239,746, are excessively complex and costly for any high-volume applications.

Others have suggested simultaneously co-depositing a silicon carbide onto a molybdenum substrate, along with the diamond. See U.S. Pat. No. 5,190,823. Such a technique, however, requires weeks of deposition time and is impractical for commercial purposes. And, it fails to address the problem of ameliorating the differences in CTE between the diamond and the substrate: the SiC has a CTE much closer to that of diamond than to those of steel or aluminum alloys, as does $Si_3N_4$, which has also been suggested as a base for sinter coating. See U.S. Pat. No. 5,137,398. Mixing SiC or $Si_3N_4$ with diamond in a single, mixed coating does still leaves a likelihood of unacceptably high residual compressive stress. And, along with the low CTE, such materials lack the ductility and other desirable properties of metal substrates.

Still other investigators have suggested depositing multiple-layer polycrystalline diamond films by HFCVD, with cooling periods between layers of diamond film. See U.S. Pat. No. 5,124,179. This technique, however, also requires prolonged deposition times.

SUMMARY OF THE INVENTION

We find that the residual stress in diamond and diamond-like carbon thin film coatings applied to metal, cermet and ceramic substrates can be reduced to acceptably low levels by using an intermediate film coating of amorphous ("glassy") metal.

Accordingly, it is an object of this invention to provide composite engineered materials having diamond or "diamond-like carbon" (a-C) or "diamond-like hydrocarbon" (a-C:H) coatings applied by CVD techniques but lacking most of the undesirable residual compressive stress induced by such techniques.

It is still another object of this invention to provide articles having multi-layer coatings in which a metal, cermet or ceramic substrate has an overlying layer in a "glassy" (amorphous) phase to which a diamond film having reduced residual stress has been applied.

It is a further object of this invention to provide articles of manufacture having such intermediate "glassy" layers and overlying diamond, diamond-like carbon or diamond-like hydrocarbon coatings, such articles including but not limited to PC boards; fasteners; bearings; cutting tools; valve seats; gears; blades; drill bits; dies; dental tools, medical prostheses or implants intended for long-term use inside the human body.

Further objects of this invention will be apparent to those skilled in the arts to which it pertains from the following detailed description.

DETAILED DESCRIPTION OF THE INVENTION

Intermediate-Layer Coatings

In its broadest embodiment, our invention comprises the provision of an intermediate layer of amorphous "glassy" metal between a metal, ceramic or cermet substrate and an overlying layer of diamond, diamond-like carbon or diamond-like hydrocarbon material. Substrates may be chosen from the group comprising metals, ceramics and cermets. Among substrate metals, we prefer to use aluminum castings in the 300 series; mild steel having 0.08% to 0.16% carbon; high carbon steel; or nickel-based superalloys. The aluminum alloy AlS380.0 (Al—8Si—3Cu—Fe) is most preferred. Suitable ceramics for the substrate are high strength carbides, nitrides, silicides, oxides and borides of such metals, while appropriate cermets include tungsten carbide with 4% to 15% cobalt or nickel.

The intermediate layer may be comprised of carbides or nitrides of aluminum, silicon, titanium, tungsten, boron, molybdenum, zirconium or tantalum. Sialons (Si—Al—O—N ceramics, specifically $Si_3Al_3O_3N_5$) also may be used. So can commercially-available Ti—6Al—4V and Si—Al—V alloys. SiC is most preferred. Generally, the preferred thickness of the intermediate layer should be in the range of 10 to 50 micro-meters. The composition of the intermediate layer should be selected and its thickness predetermined to contract during cooling more slowly and to a lesser extent than the substrate, thereby decreasing the residual stress remaining in the diamond film when cooling is completed.

To manufacture diamond-coated articles using our invention, an article machined, cast or otherwise fabricated of the desired substrate is first coated with the selected intermediate layer. Such coating can be accomplished by a variety of techniques. One suitable method is metal vapor deposition (MVD), in which a layer of fine powdered intermediate metal (e.g. Ti) is applied to the surface of the substrate and then heated at pressures on the order of $10^{-6}$ torr to a temperature of 600° C. to 700° C. or higher (depending upon the vaporization temperature of the metal) for an hour or more, resulting in vaporization of the intermediate layer and condensation on the substrate. See, for example, U.S. Pat. No. 5,224,969, which describes an application of the technique. Alternately, electron beam physical vapor deposition (EBPVD) can be used. In that technique, the substrate article is placed in a high vacuum chamber in proximity to a sample of metal or ceramic desired to be used for the intermediate layer. The intermediate layer material is exposed to a focused electron beam which vaporizes it. The intermediate layer metal or ceramic material then condenses on the surface of the substrate. Other suitable techniques for applying the intermediate layer include sputtering, sintering of powder, electroplating, electroless deposition, diffusion coating and spray coating.

Following application or creation of the intermediate amorphous "glassy" layer, a diamond or diamond-like carbon coating is applied by CVD or by a modified CVD process, such as HFCVD. The total thickness of the diamond film is at least about 0.5 micrometers, and preferably at least 1 micro-meter.

The intermediate layer is either deposited in an amorphous (glassy) phase or is converted into such a state after deposition. It is known that many types of metals and ceramics including Ti, Zr, Hf, Fe, Co, Ni, Cr, Mn, Mo, Ta, Nb, Cu, Au, Ag, B, Al and Si can be solidified or converted into an amorphous, "glassy" state lacking a defined crystalline structure. See U.S. Pat. No. 4,837,089. Metals that are particularly suitable include iron, palladium and some aluminum-based alloys containing more than 80% aluminum. See, e.g., R. Lipkin, "New Glasses Arise From Liquid's Slow Flow," Science, Apr. 1, 1995, at p. 199. Lacking defined crystal structures, such amorphous or glassy metals may have superior ductility compared to ordinary, crystalline alloys. This makes them suitable as intermediate layers between diamond coatings and substrates, since their ductility reduces residual stress in the diamond coating layer.

We find that one way to create an amorphous or "glassy" metal intermediate layer is by laser heating of the surface of the substrate itself followed by very rapid cooling. In that instance, the "glassy" intermediate layer will have a chemical composition similar or identical to that of the substrate. Alternatively, an intermediate layer of a dissimilar metal, metal alloy or ceramic comprising one or a combination of the elements listed above can be applied to a substrate using one of the techniques disclosed above. That layer can then be converted to an amorphous or "glassy" state by laser, rf or induction heating followed by extremely rapid cooling. In either instance, an overlying diamond film then can be applied by CVD or other suitable techniques.

In still another alternative method, the pyrolysis reactions that form the synthetic diamond layer may be conducted simultaneously with the laser, rf or induction heating to form the amorphous "glassy" layer. Rapid cooling prevents formation of metal crystal structures in the combined glassy metal/diamond layer.

It will be apparent to those of ordinary skill in the art that many changes and modifications could be made while remaining within the scope of our invention. We intend to cover all such equivalent articles of manufacture and processing methods, and to limit our invention only as specifically delineated in the following claims.

What is claimed is:

1. A process for applying to a substrate an amorphous coating over which a diamond coating is applied comprising:
   a. coating said substrate with an intermediate coating having a defined crystalline structure selected from the group consisting of at least one of Ti, Zr, Hf, Fe, Co, Ni, Cr, Mn, Mo, Ta, Nb, Cu, Au, Ag, B, Al and Si;
   b. converting said crystalline structure of said intermediate coating into an amorphous structure by heating with laser radiation, and after said heating, rapidly cooling said intermediate coating to maintain the amorphous structure created by the heating; and
   c. depositing over said intermediate coating an outer layer of a synthetic diamond coating by chemical vapor deposition.

2. The process of claim 1, wherein said intermediate coating has the same chemical composition as said substrate.

3. A process for creating on a substrate an amorphous layer over which a diamond coating layer is applied comprising:
   a. selecting a substrate from the group consisting of metals, cermets and ceramics and having at least one exterior surface;
   b. converting a surface layer of said substrate from a crystalline structure into an amorphous structure by heating with laser radiation, and after said heating, rapidly cooling said substrate surface to maintain the amorphous structure created by the heating; and
   c. depositing over said amorphous layer an outer layer of a synthetic diamond coating.

4. The process of claim 3 wherein said substrate is selected from the group consisting of iron, palladium and aluminum-based alloys having more than 80% aluminum content.

* * * * *